United States Patent
Kapoor et al.

(10) Patent No.: US 7,038,547 B2
(45) Date of Patent: May 2, 2006

(54) AMPLIFIER CIRCUIT

(75) Inventors: Samay P. Kapoor, Chandler, AZ (US); Antoine J. Rabany, Tempe, AZ (US)

(73) Assignee: Freescale Semiconductor, Inc., Austin, TX (US)

(*) Notice: Subject to any disclaimer, the term of this patent is extended or adjusted under 35 U.S.C. 154(b) by 36 days.

(21) Appl. No.: 10/689,240

(22) Filed: Oct. 20, 2003

(65) Prior Publication Data

US 2005/0083134 A1    Apr. 21, 2005

(51) Int. Cl.
*H03F 3/04*  (2006.01)
(52) U.S. Cl. ........................... 330/302; 330/306
(58) Field of Classification Search ............. 330/53, 330/277, 285, 286, 296, 302, 306; 333/32
See application file for complete search history.

(56) References Cited

U.S. PATENT DOCUMENTS

| | | | | |
|---|---|---|---|---|
| 5,276,406 A | * | 1/1994 | Samay et al. | 330/277 |
| 5,329,249 A | * | 7/1994 | Cripps | 330/302 |
| 6,163,222 A | * | 12/2000 | Kobayashi | 330/302 |
| 6,236,274 B1 | * | 5/2001 | Liu | 330/302 |
| 6,664,871 B1 | * | 12/2003 | Yip | 333/194 |

* cited by examiner

*Primary Examiner*—Henry Choe
(74) *Attorney, Agent, or Firm*—David G. Dolezal; James L. Clingan, Jr.

(57) ABSTRACT

An amplifier circuit has an amplifier, a D.C. bias circuit, and an output signal path. The amplifier amplifies a modulated signal that has a carrier frequency. The D.C. bias circuit has a decoupling capacitor that is coupled to a transmission line having a length equal to N times the wavelength of the carrier frequency divided by four, where N is an odd integer. A low frequency decoupling capacitor is located between the decoupling capacitor and the output of the amplifier to reduce intermodulation distortion products. In one embodiment, the low frequency decoupling capacitor is a tantalum capacitor.

27 Claims, 3 Drawing Sheets

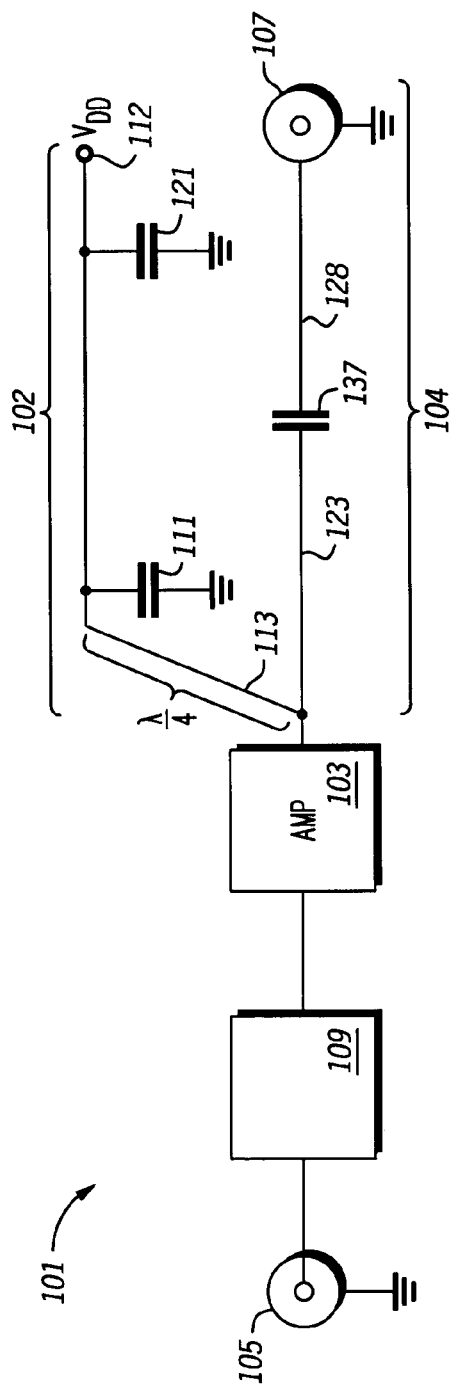
*FIG. 1* —PRIOR ART—
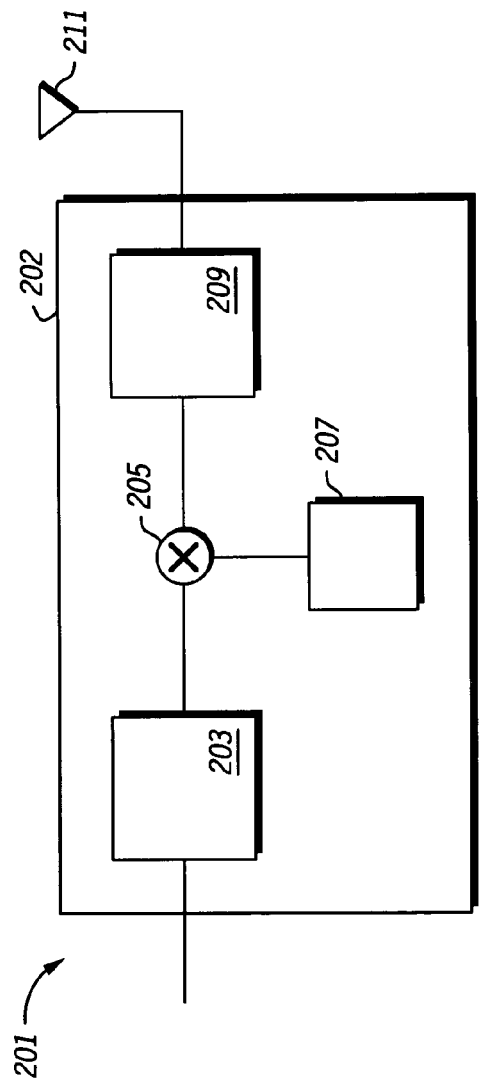
*FIG. 2*

US 7,038,547 B2

AMPLIFIER CIRCUIT

BACKGROUND OF THE INVENTION

1. Field of the Invention

This invention relates in general to amplifier circuits and more specifically to amplifier circuits with DC bias circuits.

2. Description of the Related Art

Amplifiers (e.g. radio frequency (RF) amplifiers) are utilized by devices (e.g. transmitters) to amplify a signal. FIG. 1 shows an example of a prior art amplifier circuit 101 that may be located in a transmitter (not shown). Circuit 101 is located on a printed circuit board (not shown). Circuit 101 includes an amplifier 103, an input terminal 105, and an output terminal 107. Input impedance matching circuit 109 is located between input terminal 105 and amplifier 103. An output signal path 104 couples the output of amplifier 103 to output terminal 107. Path 104 includes transmission line 123, capacitor 137, and transmission line 128 which are sized to transform the impedance of the output of amplifier 103 to the impedance output terminal 107 (e.g. 50 Ohms) at a carrier frequency of the signal (e.g. 2 GHz). Circuit 101 includes a DC bias feed path 102 coupling the output of amplifier 103 to voltage supply terminal 112 (at voltage VDD). The DC bias feed path includes $\lambda/4$ transmission line 113, decoupling capacitor 111, and low frequency decoupling capacitor 121.

Circuit 101 receives at input terminal 105 a signal and provides at output terminal 107 an amplified signal. The signal is modulated at a carrier frequency. The decoupling capacitor 111 acts as a short at the carrier frequency. $\lambda/4$ transmission line 113 transforms the short of capacitor 111 to an open at the output of amplifier 103. Thus, essentially no current at the carrier frequency propagates to voltage supply terminal 112.

At frequencies below the carrier frequency (e.g. 100 MHz and below), the DC bias feed path 102 should appear as a low impedance line such that bias current at those frequencies propagates rather unimpeded to amplifier 103 from voltage supply terminal 112.

A DC bias feed path with a low impedance line provides for lower inter-modulation distortion products and thus reduces memory effect.

One problem that may occur with circuit 101 is that the inter-modulation distortion products start to increase at frequencies above 20 MHz due to the increasing impedances of the DC bias feed path 102 at those frequencies. Such an increase in inter-modulation distortion products at those frequencies (e.g. 100 MHz and below) may be undesirable for meeting the transmission mask requirements of governing bodies (e.g. Federal Communications Commission in the United States).

What is needed is an improved amplifier circuit.

BRIEF DESCRIPTION OF THE DRAWINGS

The present invention may be better understood, and its numerous objects, features, and advantages made apparent to those skilled in the art by referencing the accompanying drawings.

FIG. 1 is a circuit diagram of a prior art amplifier circuit according to the present invention.

FIG. 2 is a block diagram of one embodiment of a portion of a communication device according to the present invention.

The use of the same reference symbols in different drawings indicates identical items unless otherwise noted.

DETAILED DESCRIPTION

Figure 3:
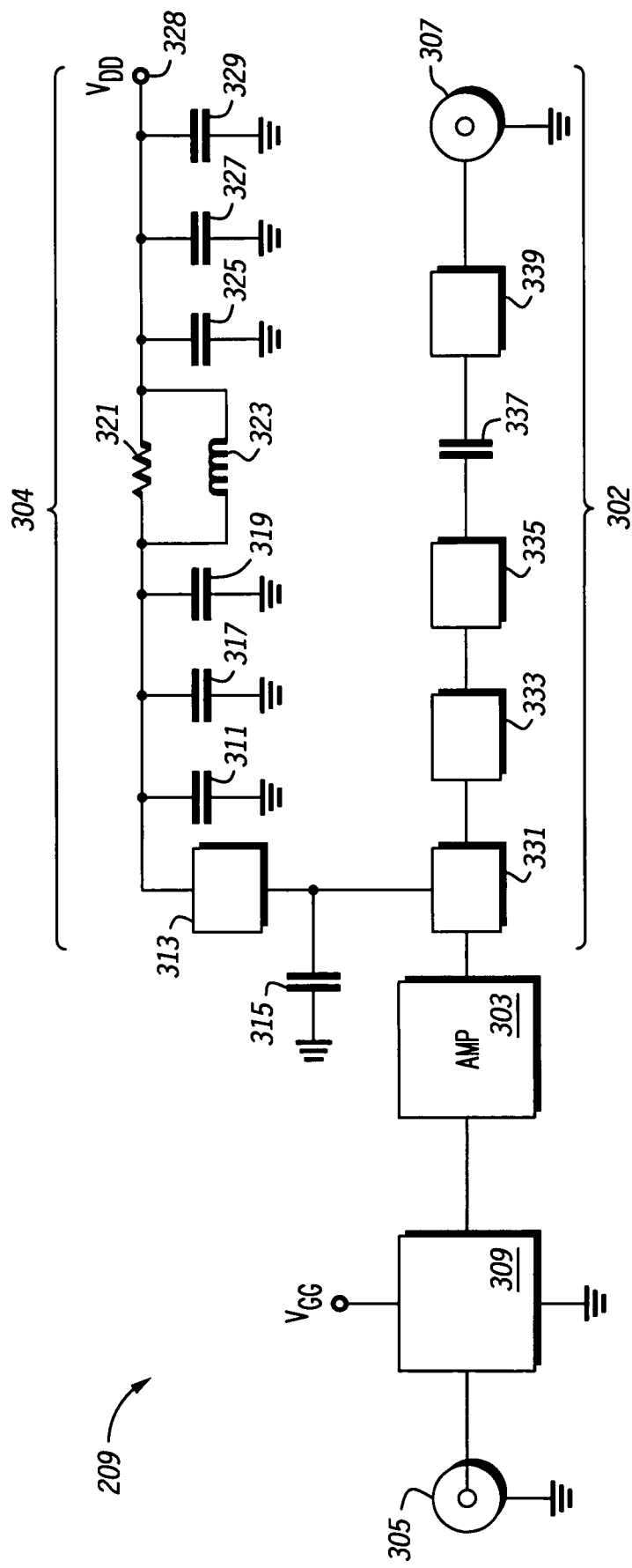
FIG. 3 is a circuit diagram of one embodiment of an amplifier circuit according to the present invention.

The following sets forth a detailed description of a mode for carrying out the invention. The description is intended to be illustrative of the invention and should not be taken to be limiting.

FIG. 2 shows a block diagram of a portion of a communication device according to the present invention. Communications device 201 includes a transmitter 202 and antennae 211 coupled to transmitter 202. Transmitter 202 includes an encoder 203 for providing a signal (e.g. a base band signal) containing data to a mixer 205 that modulates the signal at a carrier frequency provided to mixer 205 by oscillator 207. The output signal of mixer 205 is a modulated signal having a carrier frequency. In one embodiment, the carrier frequency is 2 GHz. In other embodiments, the carrier frequency may be at another RF frequency (10 KHz–4 GHz). Still in other embodiments, the carrier frequency may be at a different frequency (e.g. greater than the RF frequencies). The output signal of mixer 205 is amplified by amplifier circuit 209. The output signal of amplifier circuit 209 is provided to antennae 211 for transmission. In one embodiment, communications device 201 includes a receiver (not shown) for receiving a signal via antennae 211 and a device processor (not shown) for providing data to transmitter 202. In one embodiment, communications device is a cellular phone but may be another type of communications device in other embodiments. In other embodiments, communications device 201 may have other devices or may have other configurations. For example, communications device 201 may include another power amplifier circuit located between circuit 209 and antennae 211.

FIG. 3 is a circuit diagram of one embodiment of power amplifier circuit 209. Circuit 209 includes an amplifier 303 coupled between an input terminal 305 and an output terminal 307. In one embodiment, amplifier 303 is a laterally diffused metal oxide semiconductor device. Input terminal 305 is coupled to mixer 205, and output terminal is coupled to antennae 211 (See FIG. 2). Circuit 209 includes an input matching circuit 309 having an input coupled to input terminal 305 and an output coupled to amplifier 303. Input matching circuit 309 provides the modulated signal received via terminal 305 to an input of amplifier 303. Input matching circuit 309 includes circuitry (e.g. transmission lines, capacitors, inductors, and resistors) sized to transform the impendence at terminal 305 (e.g. 50 ohms) to the impedance at the input of amplifier 303. Matching circuit 309 is also coupled to a DC voltage supply terminal (at VGG) to provide a gate bias voltage to the input of amplifier 303.

Circuit 209 has an output matching circuit that includes output signal path 302 and DC bias feed path 304. The output of amplifier 303 is coupled to output terminal 307 via output signal path 302. In the embodiment shown, signal path 302 includes transmission line 331, transmission line 333, transmission line 335, capacitor 337, and transmission line 339. Transmission line 331 is connected to the output of amplifier 303 and transmission line 339 is connected output terminal 307. The circuitry of path 302 is sized to transform the impedance at the output of amplifier 303 to the impedance at output terminal 307 (e.g. 50 ohms) at the carrier frequency. In other embodiments, the output signal path may include other circuitry and/or have other configurations.

The output of amplifier 303 is also coupled to a voltage supply terminal 328 (at voltage VDD) via a DC bias feed path 304 that is connected to transmission line 331. Path 304 includes low frequency decoupling capacitor 315, λ/4 transmission line 313, decoupling capacitor 311, low frequency decoupling capacitors 317 and 319, resistor 321, inductor 323, and low frequency decoupling capacitors 325, 327, and 329. A λ/4 transmission line is a transmission line whose length equals the wavelength (λ) of the carrier frequency divided by four. However in other embodiments, transmission line 313 may have a length of Nλ/4 wherein N is an odd integer.

The decoupling capacitor 311 acts as a short at the carrier frequency. λ/4 transmission line 313 transforms the short of capacitor 311 to an open at the output of amplifier 303. Accordingly, essentially no current at carrier frequency propagates to voltage supply terminal 328.

At frequencies below the carrier frequency (e.g. 100 MHz and below for a 2 GHz carrier frequency), the DC bias feed path 304 should appear as a low impedance line such that current at those frequencies propagates rather unimpeded to amplifier 303 from voltage supply terminal 328. A DC bias feed path with a low impedance line provides for lower inter-modulation distortion products and thus reduces memory effect.

Low frequency decoupling capacitor 315 may act to keep the impedance of the DC bias feed path low up to higher frequencies (e.g. 70–80 MHz) than a similar circuit with no low frequency decoupling capacitor between a decoupling capacitor (e.g. 311) and amplifier (e.g. 303). Placing a low frequency decoupling capacitor (e.g. 315) between the decoupling capacitor (e.g. 311) and amplifier 303 may reduce the inductance between capacitor 315 and amplifier 303, thereby reducing the impedance seen by amplifier 303 at those frequencies.

Providing an amplifier circuit with a bias DC feed circuit having lower impedance at frequencies below the carrier frequency allows the voltage supplies to supply the necessary bias currents at those frequencies while minimizing the linearity degradation at those frequencies. This may further improve the memory effect of an amplifier circuit.

It may also be, in some embodiments, preferable to locate capacitor 315 as close to the output of amplifier 303 as physically possible. However, in some embodiments, capacitor 315 may be located closer to capacitor 311 than amplifier 303.

In one embodiment, capacitor 315 has a self resonant frequency of 5 MHz and capacitor 311 has a self resonant frequency of 2 GHz (e.g. equal to the carrier frequency). In other embodiments, the self resonance of the decoupling capacitor may be at other ratios to the self resonance of low frequency decoupling capacitor 315 (e.g. a 10 to 1 ratio or greater).

In one embodiment, amplifier 303 includes internal capacitance that is in parallel with its output (and accordingly, in parallel with bias feed line 304). This internal capacitance and bias feed line resonate at a frequency=½pi $(LC)^2$ where C is the internal capacitance of amplifier 303 and L is the inductance of the DC bias feed path 304. At this frequency of resonance, the voltage supply terminal 328 is decoupled from amplifier 303. Thus, decreasing the inductance L of the bias feed by adding a low frequency decoupling capacitor (e.g. 315) between amplifier 303 and capacitor 311 may move the resonance frequency to a higher value. This in turn lowers the impedance of DC bias feed path 304 for all frequencies up to that resonant frequency.

In one embodiment, capacitor 315 is a tantalum capacitor having a relatively low self resonant frequency (e.g. 5 MHz) which causes capacitor 315 to provide a relatively high impedance at the carrier frequency (e.g. 2 GHz). Thus, in some embodiments, capacitor 315 has a negligible effect on the performance of the output signal path. One advantage that may occur with using a tantalum capacitor for low frequency decoupling capacitor 315 is that a tantalum capacitor provides a relatively lower self resonant frequency than a ceramic capacitor of the same capacitance. In one embodiment, capacitor 311 is a ceramic capacitor.

Figure 4:
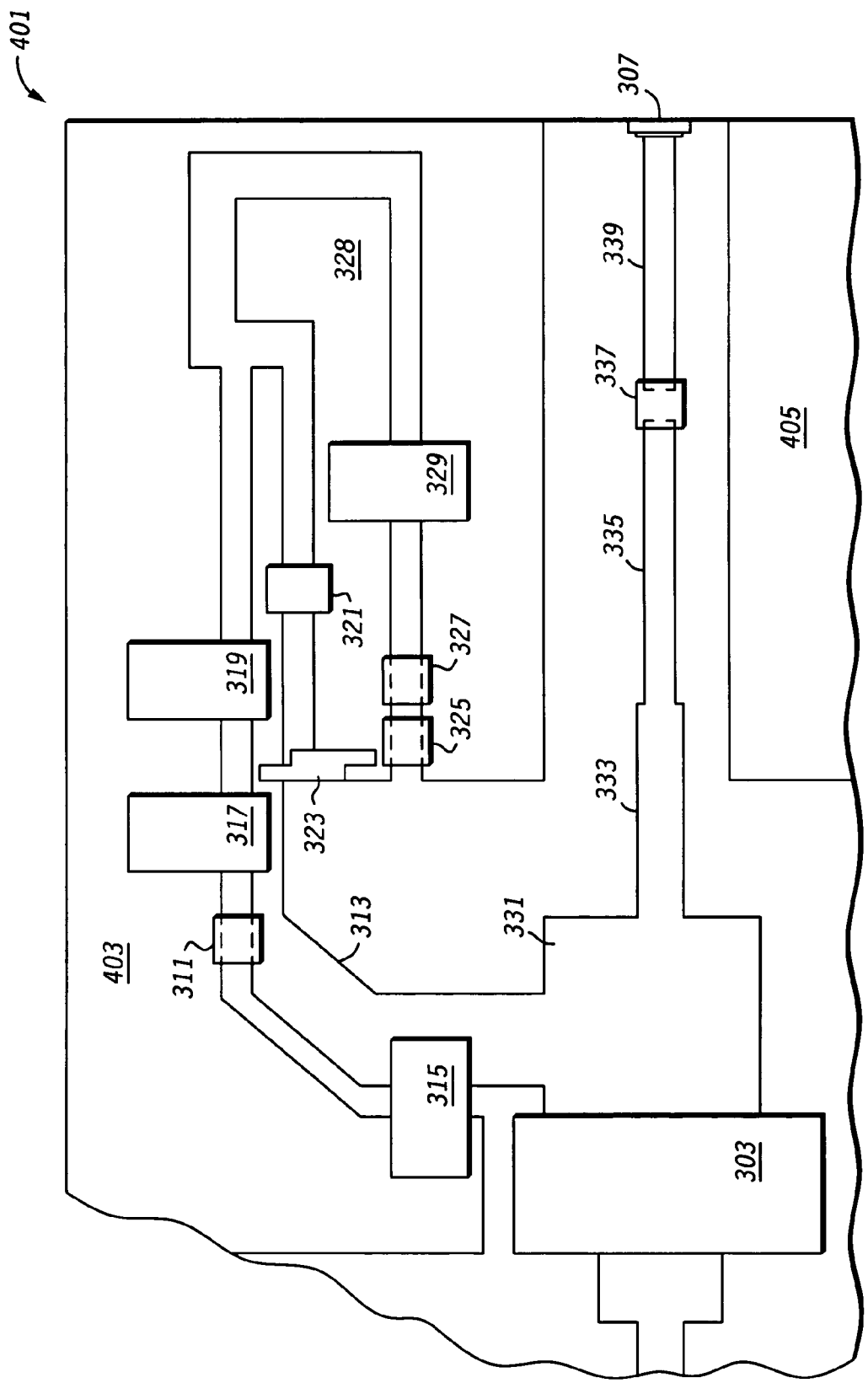
FIG. 4 partial top view of one embodiment of a portion of circuit board layout according to the present invention.

FIG. 4 is a partial top view of an embodiment of a circuit board layout of a portion of amplifier circuit 209 according to the present invention. A portion of the top side of circuit board 401 is shown in FIG. 4. Ground planes 403 and 405 are located on circuit board 401 for carrying a ground voltage supply potential. Voltage supply terminal 328 is implemented as a voltage plane and is coupled to a power supply (not shown).

In the embodiment shown, transmission lines 331, 333, 335, 339, and 313 are implemented as microstrip located on circuit board 401. Table 1 below sets forth dimensions of the microstrip for one embodiment of circuit board 401.

TABLE 1

| Transmission line | Microstrip area |
| --- | --- |
| transmission line 339 | 0.750" × 0.084" |
| transmission line 331 | 0.442" × 0.650" |
| transmission line 333 | 0.490" × 0.140" |
| transmission line 335 | 0.540" × 0.084" |
| transmission line 313 | 0.825" × 0.055" |

Table 2 below sets forth capacitor, resistor, and inductor sizes and manufacture for one embodiment of the circuit of FIG. 4.

TABLE 2

| Designators | Description |
| --- | --- |
| Capacitor 337 | 43 pF Chip Capacitor, ATC #100B430JCA500X |
| Capacitor 311 | 5.6 pF Chip Capacitor, ATC #100B5R6JCA500X |
| Capacitor 325 | 1000 pF Chip Capacitor, ATC #100B102JCA500X |
| Capacitor 327 | 0.1 µF Chip Capacitor, KEMET #CDR33BX104AKWS |
| Capacitor 319 | 10 µF Tantalum Chip Capacitor, KEMET #T495X106K035AS4394 |
| Capacitors 315, 329, 317 | 22 µF Tantalum Chip Capacitors, KEMET #T491X226K035AS4394 |
| Inductor 323 | 1 Turn, #20 AWG, 0.100" ID, MOTOROLA |
| Resistor 321 | 10 Ω ⅛ W Chip Resistors |

The dimensions and sizes given above may be varied to provide a DC bias circuit with a different frequency response. For example, the size of capacitor 315 and the width of the microstrip implementing transmission line 313 may be varied to adjust the frequency response at frequencies below 100 MHz. Furthermore, in other embodiments, the dimensions and sizes given above may be modified for amplifiers designed to amplify signals at different carrier frequencies.

In other embodiments, an amplifier circuit may have other configurations including other configurations of the DC bias feed path and the output signal path. For example, some DC bias feed paths may include a different number (e.g. one, two, or three) of low frequency decoupling capacitors located between capacitor 311 and voltage supply terminal 328. In other embodiments, the DC bias feed path would not include an inductor and/or resistor.

In other embodiments, an amplifier circuit similar to one shown and described above may be utilized in other devices for amplifying signals. For example, an amplifier circuit may be used in a laser system.

In one embodiment, a circuit includes an amplifier having an output for providing an amplified modulated signal having a carrier frequency. The circuit also includes a D.C. bias circuit with a decoupling capacitor having a first terminal coupled to the output of the amplifier and to a voltage supply terminal. The decoupling capacitor provides an open circuit at the carrier frequency. The D.C. bias circuit also includes a low frequency decoupling capacitor coupled to the output of the amplifier at a location between the output of the amplifier and the first terminal of the coupling capacitor.

In another embodiment, a circuit includes an amplifier having an output for providing an amplified modulated signal having a carrier frequency. The carrier frequency has a wavelength. The circuit also includes a D.C. bias circuit. The D.C. bias circuit includes a transmission line having a first end coupled to the output of the amplifier and a second end. A distance between the first end and the second end equals N times the wavelength divided by four, where N is an odd integer. The D.C. bias circuit also includes a decoupling capacitor coupled to the second end of the transmission line. The D.C. bias circuit further includes a low frequency decoupling capacitor coupled to the output of the amplifier at a location between the output of the amplifier and the decoupling capacitor.

In another embodiment, a circuit includes an input matching circuit having an input for receiving a modulated signal and an output. The modulated signal has a carrier frequency. The carrier frequency has a wavelength. The circuit also includes an amplifier having an input coupled to the output of the input matching circuit and an output. The circuit also includes an output matching circuit having an input coupled to the output of the amplifier and an output. The output matching circuit includes an output signal path and a D.C. bias feed path. The D.C. bias feed path includes a transmission line having a first end coupled to the output of the amplifier and a second end. A distance between the first end and the second end equals N times the wavelength divided by four, where N is an odd integer. The D.C. bias feed path also includes a decoupling capacitor having a first terminal coupled to the second end of the transmission line. The D.C. bias feed path further includes a low frequency decoupling capacitor coupled to the output of the amplifier at a location between the output of the amplifier and the first terminal of the decoupling capacitor.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A circuit, comprising:
    an amplifier having an output for providing an amplified modulated signal having a carrier frequency; and
    a D.C. bias circuit comprising:
        a decoupling capacitor having a first terminal coupled to the output of the amplifier and to a voltage supply terminal, the decoupling capacitor providing an open circuit at the carrier frequency; and
        a low frequency decoupling capacitor coupled to the output of the amplifier at a location between the output of the amplifier and the first terminal of the decoupling capacitor;
    wherein the D.C. bias circuit further comprises:
        a transmission line having a first end coupled to the output of the amplifier and a second end coupled to the first terminal of the decoupling capacitor;
        wherein the carrier frequency has a wavelength;
        wherein a distance between the first end and the second end is equal to N times the wavelength divided by four, where N is an odd integer;
        wherein the low frequency decoupling capacitor is coupled to the transmission line between the output of the amplifier and the second end.

2. The circuit of claim 1, wherein the low frequency decoupling capacitor has a self resonant frequency lower than that of the decoupling capacitor.

3. The circuit of claim 1, wherein the low frequency decoupling capacitor has a self resonant frequency that is no higher than one tenth of that of the decoupling capacitor.

4. The circuit of claim 1, wherein the low frequency decoupling capacitor is a tantalum capacitor.

5. The circuit of claim 1 wherein the transmission line is implemented as microstrip.

6. A circuit, comprising:
    an amplifier having an output for providing an amplified modulated signal having a carrier frequency;
    a D.C. bias circuit comprising:
        a decoupling capacitor having a first terminal coupled to the output of the amplifier and to a voltage supply terminal, the decoupling capacitor providing an open circuit at the carrier frequency: and
        a low frequency decoupling capacitor coupled to the output of the amplifier at a location between the output of the amplifier and the first terminal of the decoupling capacitor;
    a first transmission line coupled between the decoupling capacitor to the output of the amplifier;
    an output signal path having an input coupled to the output of the amplifier and an output terminal for proving an output signal of the amplifier circuit, wherein the output signal path comprises at least an initial transmission line that is connected to the output of the amplifier and wherein the first transmission line is coupled to the initial transmission line;
    wherein:
        the carrier frequency has a wavelength;
        the first transmission line has a first end connected to the initial transmission line and a second end coupled to the decoupling capacitor, wherein the first transmission line has a length from the first end to the second end equal to N times the wavelength divided by four, where N is an odd integer.

7. The circuit of claim 1, wherein the low frequency decoupling capacitor is a tantalum capacitor and the decoupling capacitor is a ceramic capacitor.

8. The circuit of claim 1, wherein the decoupling capacitor has a self resonant frequency equal to the carrier frequency.

9. A transmitter including the circuit of claim 1 and further comprising:
    a mixer having an output coupled to an input terminal of the circuit.

10. The circuit of claim 1 wherein the carrier frequency is in a range of 100 MHz to 4 GHz.

11. A circuit, comprising:
an amplifier having an output for providing an amplified modulated signal having a carrier frequency, the carrier frequency having a wavelength;
a D.C. bias circuit comprising:
  a transmission line having a first end coupled to the output of the amplifier and a second end, wherein a distance between the first end and the second end equals N times the wavelength divided by four, where N is an odd integer;
  a decoupling capacitor coupled to the second end of the transmission line; and
  a low frequency decoupling capacitor coupled to the output of the amplifier at a location between the output of the amplifier and the decoupling capacitor.

12. The circuit of claim 11, wherein the low frequency decoupling capacitor has a self resonant frequency lower than that of the decoupling capacitor.

13. The circuit of claim 11, wherein the low frequency decoupling capacitor has a self resonant frequency that is no higher than one tenth of that of the decoupling capacitor.

14. The circuit of claim 11, wherein the low frequency decoupling capacitor is a tantalum capacitor.

15. The circuit of claim 11, wherein the decoupling capacitor is a ceramic capacitor.

16. The circuit of claim 11, further comprising an output signal path having an input coupled to the output of the amplifier and an output terminal for providing an output signal of the circuit, wherein the output signal path comprises at least an initial transmission line that is connected to the output of the amplifier and wherein the first end of the transmission line is connected to the initial transmission line.

17. The circuit of claim 11, wherein the D.C. bias circuit further comprises:
  a second transmission line coupled between the second end of the transmission line and a voltage supply terminal; and
  a second low frequency decoupling capacitor coupled to the second transmission line.

18. The circuit of claim 11, wherein the low frequency decoupling capacitor is a tantalum capacitor and the decoupling capacitor is a ceramic capacitor.

19. The circuit of claim 11 wherein the low frequency decoupling capacitor includes a terminal connected to the transmission line.

20. The circuit of claim 11 wherein the low frequency decoupling capacitor includes a terminal connected to the transmission line.

21. The circuit of claim 11 wherein the carrier frequency is in a range of 100 MHz to 4 GHz.

22. A circuit, comprising:
an input matching circuit having an input for receiving a modulated signal and an output,
  wherein the modulated signal has a carrier frequency, the carrier frequency has a wavelength;
an amplifier having an input coupled to the output of the input matching circuit and an output; and
an output matching circuit having an input coupled to the output of the amplifier and an output, wherein the output matching circuit comprises an output signal path and a D.C. bias feed path, wherein the D.C. bias feed path comprises:
  a transmission line having a first end coupled to the output of the amplifier and a second end, wherein a distance between the first end and the second end equals N times the wavelength divided by four, where N is an odd integer;
  a decoupling capacitor having a first terminal coupled to the second end of the transmission line; and
  a low frequency decoupling capacitor coupled to the output of the amplifier at a location between the output of the amplifier and the first terminal of the decoupling capacitor.

23. The circuit of claim 22, wherein the low frequency decoupling capacitor is a tantalum capacitor.

24. The circuit of claim 22, wherein the decoupling capacitor is a ceramic capacitor.

25. The circuit of claim 22, wherein the low frequency decoupling capacitor is characterized has having a self resonant frequency that is no more than one tenth a frequency of the carrier frequency.

26. The circuit of claim 22 wherein:
  the output signal path comprises an initial transmission line that is connected to the output of the amplifier; and
  the first end of the transmission line is connected to the initial transmission line.

27. The circuit of claim 22 wherein the carrier frequency is in a range of 100 MHz to 4 GHz.

* * * * *